United States Patent
Itoh et al.

(10) Patent No.: US 9,337,410 B2
(45) Date of Patent: May 10, 2016

(54) MULTILAYER PIEZOELECTRIC ELEMENT

(71) Applicant: TDK Corporation, Minato-ku, Tokyo (JP)

(72) Inventors: Syuuzi Itoh, Tokyo (JP); Satoshi Ozawa, Tokyo (JP); Atsushi Tamura, Tokyo (JP)

(73) Assignee: TDK Corporation, Tokyo (JP)

( * ) Notice: Subject to any disclaimer, the term of this patent is extended or adjusted under 35 U.S.C. 154(b) by 550 days.

(21) Appl. No.: 13/925,236

(22) Filed: Jun. 24, 2013

(65) Prior Publication Data

US 2013/0342082 A1 Dec. 26, 2013

(30) Foreign Application Priority Data

Jun. 22, 2012 (JP) ................. 2012-141340

(51) Int. Cl.
*H01L 41/083* (2006.01)
*H01L 41/047* (2006.01)
*H01L 41/04* (2006.01)

(52) U.S. Cl.
CPC ............ *H01L 41/0838* (2013.01); *H01L 41/04* (2013.01); *H01L 41/083* (2013.01)

(58) Field of Classification Search
USPC ................................................. 310/328, 366
See application file for complete search history.

(56) References Cited

U.S. PATENT DOCUMENTS

| | | | |
|---|---|---|---|
| 2006/0132001 A1 | 6/2006 | Sugg | |
| 2007/0114888 A1* | 5/2007 | Tokumiya | ..................... 310/328 |
| 2011/0121684 A1 | 5/2011 | Cooke et al. | |
| 2013/0193810 A1* | 8/2013 | Ozawa et al. | ................. 310/366 |
| 2015/0131194 A1* | 5/2015 | Park et al. | .................. 361/275.3 |

FOREIGN PATENT DOCUMENTS

| | | | | |
|---|---|---|---|---|
| CN | 1717816 A | | 1/2006 | |
| DE | WO-2011-091938 A1 | * | 8/2011 | ............ H01L 41/047 |
| EP | 1923925 A1 | * | 5/2008 | .............. H01L 37/04 |
| JP | 4-65106 A | * | 3/1992 | .................. 361/321.2 |
| JP | 2008-159966 A | * | 7/2008 | ............... H01G 4/40 |
| JP | WO-2012-011302 A1 | * | 1/2012 | ............ H01L 41/083 |
| JP | 2013-157406 A | * | 8/2013 | ............ H01L 41/083 |
| WO | WO 2007/052599 A1 | | 5/2007 | |

* cited by examiner

*Primary Examiner* — Thomas Dougherty
(74) *Attorney, Agent, or Firm* — Arent Fox LLP

(57) ABSTRACT

An element body having a first and second internal electrodes exposure surface comprising a piezoelectric active area, wherein a first internal electrode faces a second internal electrode sandwiching piezoelectric body layer in-between along laminating direction, and a piezoelectric inactive area, wherein the piezoelectric body layer contacts only first or second internal electrode at one face along laminating direction, or the first internal electrodes or the second internal electrodes respectively face each other sandwiching piezoelectric body layer in-between along laminating direction, an insulating layer which covers the piezoelectric active area of the first and second internal electrodes exposure surface, and a resistance layer which is isolated from the piezoelectric active area by the insulating layer, placed at the first and second internal electrodes exposure surface connecting at least a part of the first and that of the second internal electrode in the piezoelectric inactive area and has lower electrical resistance value relative to that of the piezoelectric body layer.

10 Claims, 11 Drawing Sheets

MULTILAYER PIEZOELECTRIC ELEMENT

BACKGROUND OF THE INVENTION

1. Field of the Invention

The present invention relates to a multilayer piezoelectric element. More precisely, the present invention relates to a multilayer piezoelectric element which can prevent a characteristic degradation caused by a pyroelectric effect.

2. Description of the Related Art

The piezoelectric element is an element, which mutually transforms between mechanical displacement and electric displacement by using piezoelectric effect and inverse piezoelectric effect. Such piezoelectric elements are manufactured e.g. by forming and firing a piezoelectric ceramic to obtain element body, forming electrode thereto, and further performing polarization treatment.

The mechanical displacement caused by the piezoelectric element is relatively small; and that the piezoelectric element is suitably used for such as an actuator in which accuracy and exactness is required. In concrete, it is used for such as a lens driver, a head driver of HDD, a head driver for ink-jet printer, a fuel injection valve driver, and the like.

These piezoelectric elements, when used in portable electronic devices and the like, will be exposed to a temperature change caused by surrounding environmental changes.

When assumed to be exposed to such temperature change, a problem such as deterioration of polarization degree due to pyroelectric effect may occur to piezoelectric element. Particularly, in the course of temperature decrease, a voltage will be applied to a piezoelectric element in an inverse direction of a voltage applied during polarization treatment by charges due to pyroelectric effect; and that polarization degree of the piezoelectric element is likely to be decreased when said voltage is too large. There is little hope for the polarization degree decreased in such way to recover in the course of temperature increase, and that polarization degree shows gradual decline as temperature changes repeatedly. As a consequence, it causes a problem of piezoelectric element characteristic degradation, such as not obtaining a desired displacement.

In order to handle such problems, Patent Article 1 (International Laid-Open Patent No. 2007/052599) describes a technique wherein an internal electrode exposed to a side surface of multilayer piezoelectric element is covered with an exterior material for preventing migration, and a conducting particle is dispersed to the exterior material.

In addition, Patent Article 1 also describes that decrease of polarization degree due to pyroelectric effect can be inhibited by the conducting particle dispersed exterior material.

SUMMARY OF THE INVENTION

However, within the conventional exterior material including conducting particles, a locally law resistance value part is formed such as by aggregation of conducting particles. And through this part, a problem of generating a short circuit between internal electrodes is caused. In particular, as a distance between internal electrodes (a thickness of piezoelectric body layer) becomes smaller, this issue becomes more apparent.

In addition, with the conventional technique wherein one exterior material intends to protect migration and to inhibit polarization degree decrease, the exterior material is required to serve both functions. Thus, selection of the constitutional materials and an adjustment of compounding ratio were difficult; and there was a problem of adjusting resistance value of the exterior material.

Considering such situations, an object of the present invention is to provide a multilayer piezoelectric element wherein characteristic degradation due to pyroelectric effect can be securely inhibited and thinning of piezoelectric body layer is easy providing excellent productivity.

In order to achieve the above object, multilayer piezoelectric element according to the present invention comprises;

an element body having a first and second internal electrodes exposure surface (hereinafter referred to as "a both electrodes exposure surface") comprising a piezoelectric active area wherein a first internal electrode faces a second internal electrode sandwiching piezoelectric body layer in-between along laminating direction and a piezoelectric inactive area wherein the piezoelectric body layer contacts only the first internal electrode or the second internal electrode at one face along laminating direction, or the first internal electrodes face each other or the second internal electrodes face each other sandwiching piezoelectric body layer in-between along laminating direction, an insulating layer which covers the piezoelectric active area of a both electrodes exposure surface, an resistance layer which is isolated from the piezoelectric active area by the insulating layer, is placed at the both electrodes exposure surface in order to connect at least one part of the first internal electrode in the piezoelectric inactive area and at least one part of the second internal electrode in the piezoelectric inactive area, and has lower electrical resistance value relative to that of the piezoelectric body layer, the first external electrode electrically connected to the first internal electrode, and the second external electrode electrically connected to the second internal electrode.

According to the multilayer piezoelectric element of the present invention, piezoelectric active area at a both electrodes exposure surface is covered by an insulating layer preventing migration, and in addition, the first internal electrode and the second internal electrode exposed to piezoelectric inactive area are connected by the resistance layer preventing polarization degree decrease due to pyroelectric effect. Further, occurrence of short circuits between internal electrodes due to unevenness of conducting particles in resistance layer can be prevented since the resistance layer is isolated from the piezoelectric active area by the insulating layer.

Therefore, according to multilayer piezoelectric element of the present invention, distance between the first internal electrode and the second internal electrode in piezoelectric active area can be made small, and that it is preferable for downsizing. Further, unevenness in resistance layer is acceptable to some extent, and that it is easily manufactured. In addition, it is only necessary for the resistance layer to contact the first internal electrode and the second internal electrode in the both electrodes exposure surface; and that this is easily manufactured relative to an embodiment forming resistance layer which straddles multiple surfaces of element body. Note that the insulating layer is only necessary to prevent migration, and that migration prevention effect of multilayer piezoelectric element according to the present invention can be certainly achieved at a low price.

Further, for instance, the element body may comprise a first surface and a second surface, which sandwich the both electrodes exposure surface in a direction perpendicular to the laminating direction, and face in mutually opposing direction. The first external electrode may be placed at the first surface and the second external electrode may be placed at the second surface.

Multilayer piezoelectric element, wherein both side surfaces sandwiching the both electrode exposure surface respectively place the first external electrode and the second external electrode, can simplify its laminating pattern and is easily manufactured.

Further, for instance, the resistance layer may be connected to the first external electrode and the second external electrode.

Resistance layer not only connects the first internal electrode and the second internal electrode on the both electrodes exposure surface, but also connects the first external electrode and the second external electrode. Thus, decrease in polarization degree due to pyroelectric effect can be securely protected.

Further, for instance, the insulating layer may comprise an expanded portion covering the piezoelectric inactive area, and a cutout may be formed at the expanded portion in order to expose at least a part of the first internal electrode and that of the second internal electrode in the piezoelectric inactive area.

Insulating layer may cover piezoelectric inactive area except for resistance layer placed position. The first internal electrode and the second internal electrode are protected by covering piezoelectric inactive area by insulating layer.

Further, for instance, the resistance layer may be placed at the center part of the both electrodes exposure surface along the laminating direction.

Although shapes of the resistance layer is not particularly limited, when it is placed at said center part along laminating direction for instance, a contact between the resistance layer and the other members placed near both ends of multilayer piezoelectric element can be avoided when mounting the multilayer piezoelectric element.

Further, for instance, the resistance layer may be separately placed at 2 or more places on the both electrodes exposure surface, sandwiching at least a part of the insulating layer along the laminating direction.

The resistance layer may be separately placed at 2 or more places. When it is separately placed near both ends of multilayer piezoelectric element, a contact between the resistance layer and the other members placed near center part of multilayer piezoelectric element can be avoided, when mounting the multilayer piezoelectric element.

Hereinafter, the present invention will be described based on embodiments shown in drawings.

THE FIRST EMBODIMENT

Figure 1:
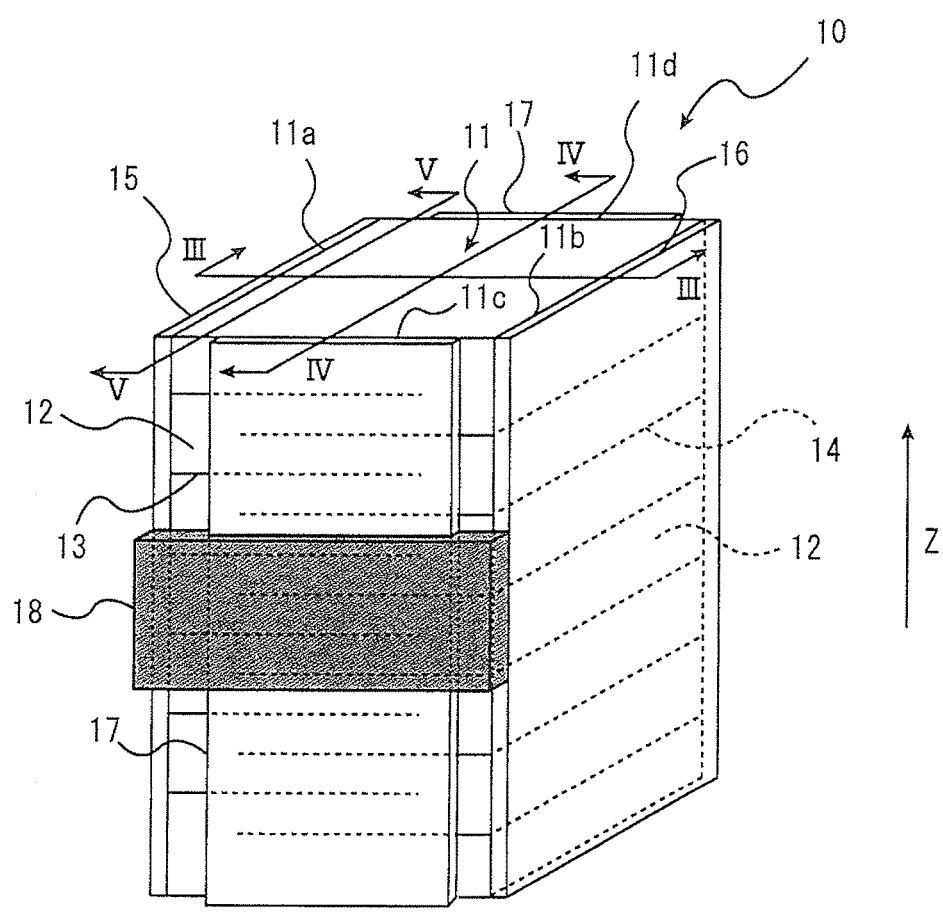
FIG. 1 is a schematic perspective view of a multilayer piezoelectric element according to the first embodiment of the present invention emphasizing resistance layer, in particular.

As shown in FIG. 1, a multilayer piezoelectric element 10 according to the first embodiment has an approximate rectangular parallelepiped shape and comprises element body 11, the first external electrode 15, the second external electrode 16, insulating layer 17 and resistance layer 18. Element body 11 has an approximate rectangular parallelepiped shape which is slightly smaller than multilayer piezoelectric element 10. The first external electrode 15, the second external electrode 16, insulating layer 17 and resistance layer 18 are formed on the first side surface 11a to the fourth side surface 11d of element body 11.

Figure 3:
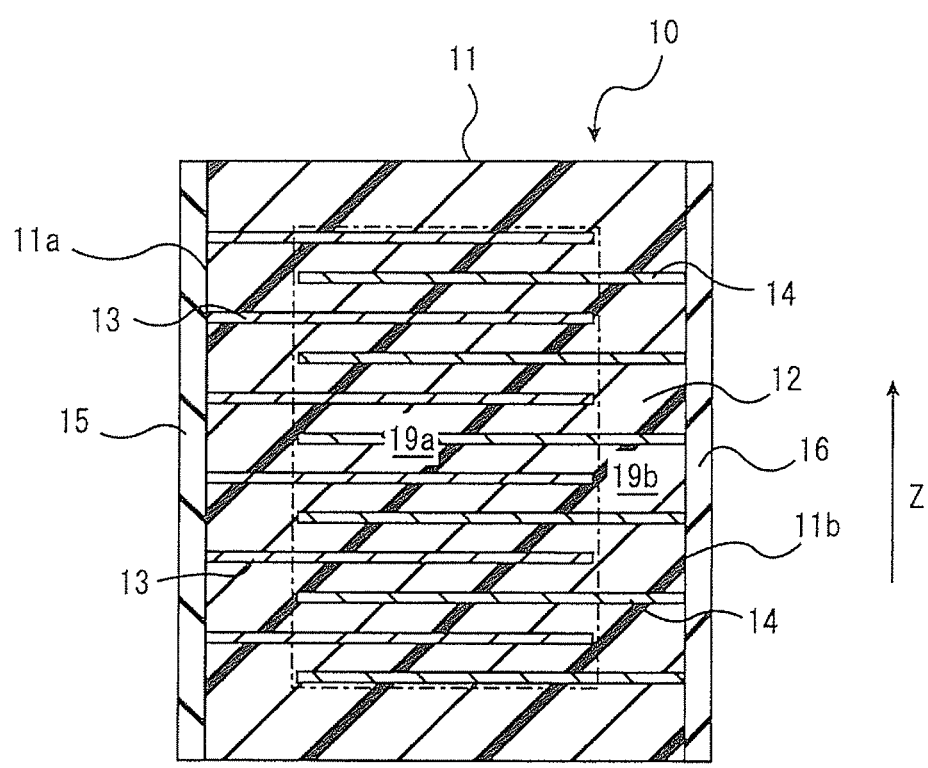
FIG. 3 is a schematic sectional view cut along line of FIG. 1.
Figure 4:
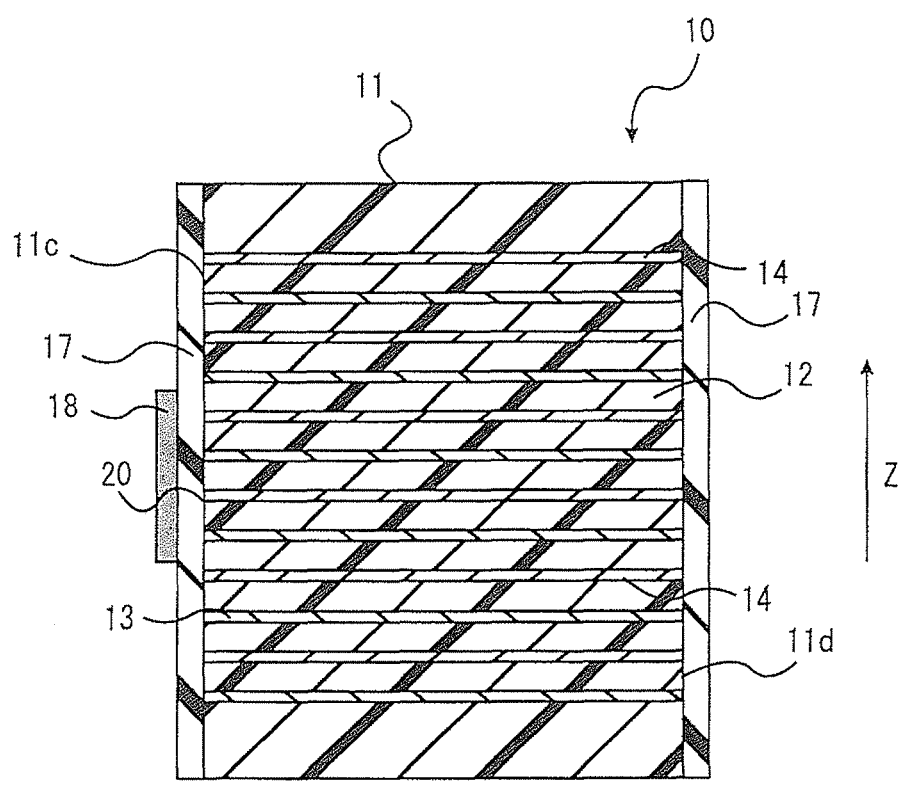
FIG. 4 is a schematic sectional view cut along IV-IV line of FIG. 1.

Element body 11 has an internal structure wherein piezoelectric body layer 12, the first internal electrode 13 and the second internal electrode 14 are laminated along laminating direction Z. As shown in FIGS. 3 and 4, at the center part of element body 11, the first internal electrode 13 and the second internal electrode 14 are laminated having piezoelectric body layer 12 in-between. The first internal electrode 13 and the second internal electrode 14 extend approximately parallel to one another in a direction perpendicular to laminating direction Z. As shown in FIG. 3, the first internal electrode 13 discontinues before the second side surface 11b of element body 11; and the second internal electrode 14 discontinues before the first side surface 11a, faces in the opposite direction of the second side surface 11b.

As shown in FIG. 3, the first external electrode 15 is placed on the first side surface 11a, wherein the second internal electrode 14 is not exposed and only the first internal electrode 13 is exposed. The first external electrode 15 and the first internal electrode 13 are electrically and physically connected. The first external electrode 15 and the first internal electrode 13 are both made of conducting materials; and that basically they become approximate unipotential.

On the other hand, the second external electrode 16 is placed on the second side surface 11b, wherein the first internal electrode 13 is not exposed and only the second internal electrode 14 is exposed. The second external electrode 16 and the second internal electrode 14 are electrically and physically connected. The second external electrode 16 and the second internal electrode 14 are both made of conducting materials; and that basically they become approximate unipotential.

Although noble metals, such as Ag, Pd, Au, Pt and their alloys (Ag—Pd and the like), and base metals, such as Cu, Ni and their alloys, are exemplified for conducting materials composing the first internal electrode 13 and the second internal electrode 14, they are not particularly limited. Conducting materials composing the first external electrode 15 and the second external electrode 16 are also not particularly limited; and the same material with the conducting material composing internal electrodes can be used. Note that a coating layer or a sputtering layer of the above-mentioned various metals can further be formed on the outer side of the first external electrode 15 and the second external electrode 16.

As shown in FIG. 3, piezoelectric active site 19*a* is formed at the center part of element body 11, wherein the first internal electrode 13 and the second internal electrode 14 face one other sandwiching piezoelectric body layer 12 in-between. Voltage is applied to piezoelectric body layer 12 of piezoelectric active site 19*a* via the first internal electrode 13 and the second internal electrode 14, mutually having different polarity, generating mechanical displacement.

On the other hand, piezoelectric inactive site 19*b* is formed on the periphery of piezoelectric active site 19*a*. Piezoelectric inactive site 19*b* comprises a contacting part, wherein piezoelectric body layer 12 contacts the first internal electrode 13 or the second internal electrode 14 at one face along laminating direction Z, and a facing part, wherein the first internal electrodes 13 mutually face or the second internal electrodes 14 mutually face sandwiching piezoelectric body layer 12 in-between along laminating direction Z. Voltage is not actively applied to piezoelectric inactive site 19*b*, depending on the first internal electrode 13 and the second internal electrode 14.

Although thickness of piezoelectric body layer 12 in piezoelectric active site 19*a* is not particularly limited, it is preferably around 5 to 50 μm according to the present embodiment. Note that thickness of piezoelectric body layer 12 in piezoelectric inactive site 19*b* on both ends of element body 11 is thicker than that in piezoelectric active site 19*a*. Materials of piezoelectric body layer 12 are not particularly limited as long as they show piezoelectric effect or inverse piezoelectric effect; and $PbZr_xTi_{1-x}O_3$, $BaTiO_3$ and the like are exemplified. In addition, components to improve characteristics and the like may be contained; and their contained amounts may be suitably determined according to desired characteristics.

As shown in FIG. 1, according to side surfaces of element body 11 which extend along laminating direction Z, although only the first internal electrode 13 is exposed on the first side surface 11*a* and only the second internal electrode 14 is exposed on the second side surface 11*b*, both the first internal electrode 13 and the second internal electrode 14 are exposed on the third side surface 11*c* and the fourth side surface 11*d*, which connect the first side surface 11*a* and the second side surface 11*b*. Thus, the first internal electrode 13 and the second internal electrode 14 are both electrodes exposure surfaces.

Figure 6:
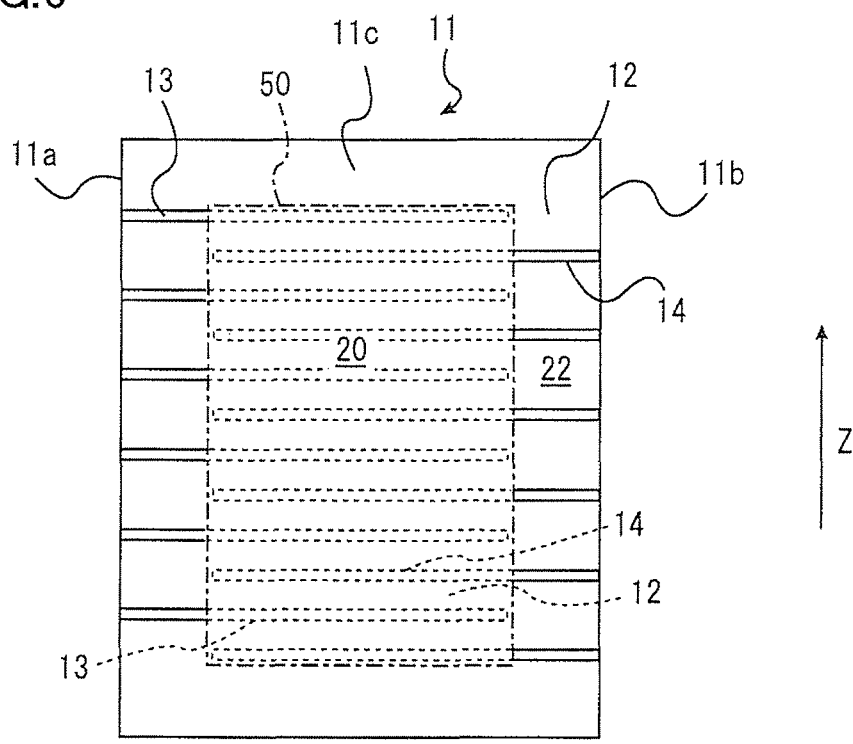
FIG. 6 is a planar view showing piezoelectric active area and piezoelectric inactive area on a both electrodes exposure surface.

FIG. 6 is a planar conceptual figure showing the third side surface 11*c* of element body 11. As shown in FIG. 6, the third side surface 11*c* comprises piezoelectric active area 20 and piezoelectric inactive area 22. In FIG. 6, piezoelectric active area 20 is shown by a dotted line, which is equivalent to inner side of a boxed dashed-dotted line 50. In piezoelectric active area 20, the first internal electrode 13 and the second internal electrode 14 mutually face sandwiching piezoelectric body layer 12 in-between along laminating direction Z. Piezoelectric active area 20 is an area where piezoelectric active site 19*a* described in FIG. 3 is exposed to the third side surface 11*c*, and voltage is applied by the first internal electrode 13 and the second internal electrode 14 generating mechanical displacement.

In FIG. 6, piezoelectric inactive area 22 is equivalent to outer side of a boxed dashed-dotted line 50 and is shown by a solid line. In piezoelectric inactive area 22, either piezoelectric body layer 12 contacts the first internal electrode 13 or the second internal electrode 14 at one face along laminating direction Z, or the first internal electrodes 13 face each other or the second internal electrodes 14 face each other sandwiching piezoelectric body layer 12 in-between along laminating direction Z. Piezoelectric inactive area 22 is an area where piezoelectric inactive site 19*b* descried in FIG. 3 is exposed to the third side surface 11*c*, and voltage is not actively applied depending on the first internal electrode 13 and the second internal electrode 14. Note that although the fourth side surface 11*d* also comprises piezoelectric active area and piezoelectric inactive area, its explanation will be abbreviated since it is the same with the third side surface 11*c* shown in FIG. 6.

Figure 2:
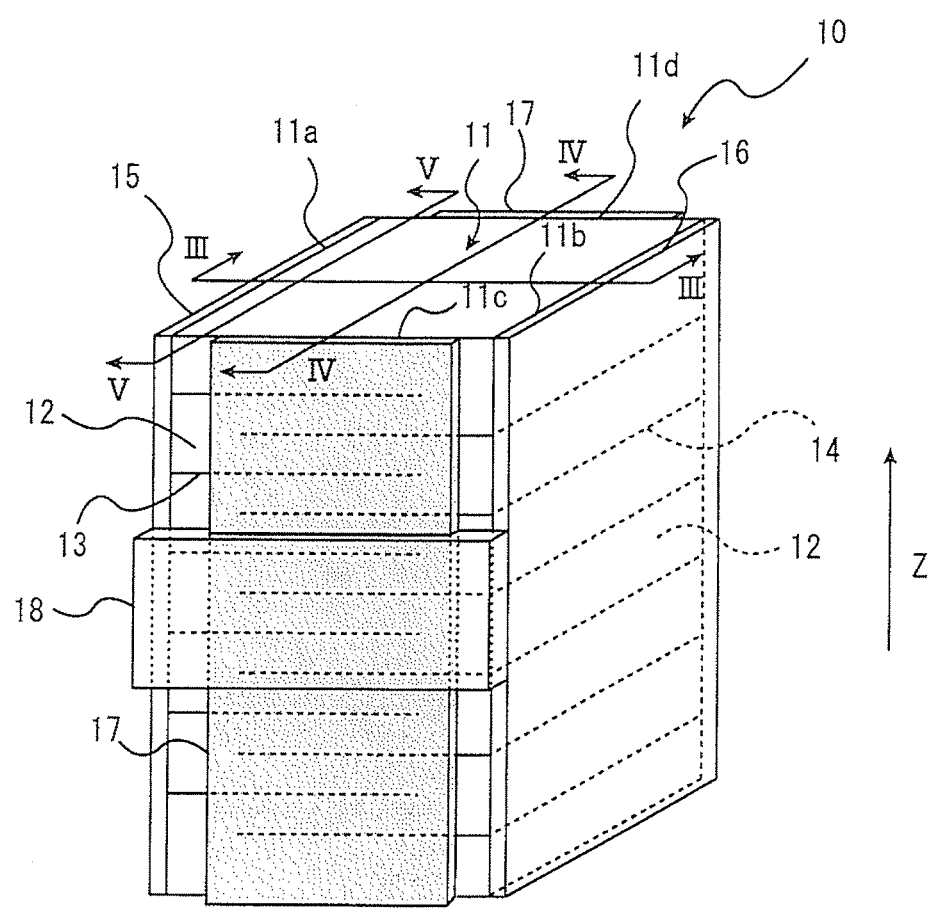
FIG. 2 is a schematic perspective view of a multilayer piezoelectric element according to the first embodiment of the present invention emphasizing insulating layer, in particular.

As shown in FIGS. 1 and 2, insulating layer 17 is placed on the third side surface 11*c* and the fourth side surface 11*d*. In FIG. 2, insulating layer 17 of a multilayer piezoelectric element 10 is emphasized by a shaded area. Insulating layer 17 covers piezoelectric active area 20 (see FIG. 6) of the third side surface 11*c* and the fourth side surface 11*d*. However, insulating layer 17 does not cover at least one part of piezoelectric inactive area 22 of the third side surface 11*c*.

Further, as shown in FIG. 2 and a sectional view of FIG. 4, insulating layer 17 is continuous from a top end to a bottom end of the third side surface 11*c* and those of the fourth side surface 11*d*. However, a shape of insulating layer 17 may not be limited to those. For instance, piezoelectric inactive area 22 (see FIG. 6) placed near the top and bottom ends of the third side surface 11*c* and the fourth side surface 11*d* may not be covered with insulating layer 17.

Material of insulating layer 17 is not particularly limited as long as it is superior in insulation property, prevents ingress of moisture and prevents migration between internal electrodes. Resin, glass and the like can be exemplified for a concrete material. Further, although electrical resistance value of insulating layer 17 is not particularly limited as long as it can secure an insulation property, it is preferably $10^9 \Omega$ or more in the present embodiment. Thickness of insulating layer 17 is not particularly limited, and it is approximately 1 to 20 μm.

As shown in FIG. 1, in addition to insulating layer 17, resistance layer 18 is placed on the third side surface 11*c* of element body 11. In FIG. 1, resistance layer 18 of a multilayer piezoelectric element 10 is emphasized by a shaded area.

As shown in FIG. 1 and a sectional view of FIG. 4, resistance layer 18 is isolated from piezoelectric active area 20 (See FIG. 6) of the third side surface 11*c* by insulating layer 17. In addition, as shown in FIG. 1 and a sectional view of FIG. 5, resistance layer 18 contacts with at least a part of the first internal electrode 13 in piezoelectric inactive area 22 (see FIG. 6) of the third side surface 11*c* and at least a part of the second internal electrode 14 in piezoelectric inactive area 22 of the third side surface 11*c*. Thus, as shown in FIG. 1, resistance layer 18 electrically and physically connects the first internal electrode 13 and the second internal electrode 14.

Figure 5:
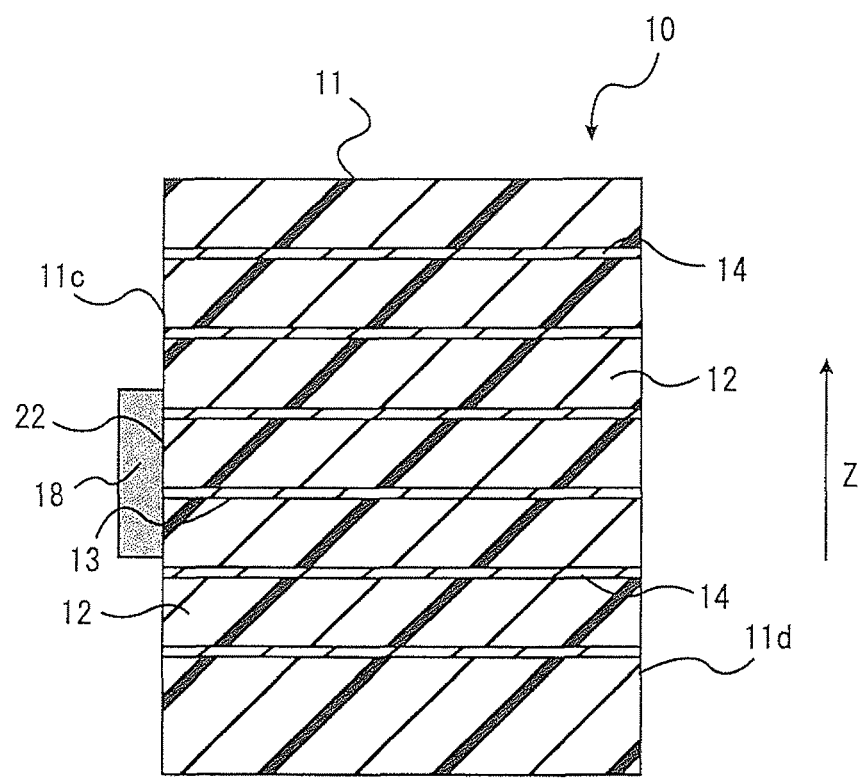
FIG. 5 is a schematic sectional view cut along V-V line of FIG. 1.

Although resistance layer 18 has a strip-shaped form which extends along a direction perpendicular to laminating direction Z, the shape of resistance layer 18 is not particularly limited. Further, as shown in FIGS. 5 and 6, although resistance layer 18 is only placed on the third side surface 11*c* within a multilayer piezoelectric element 10, it may be placed on the fourth side surface 11*d* or on both the third side surface 11*c* and the fourth side surface 11*d*.

Figure 10:
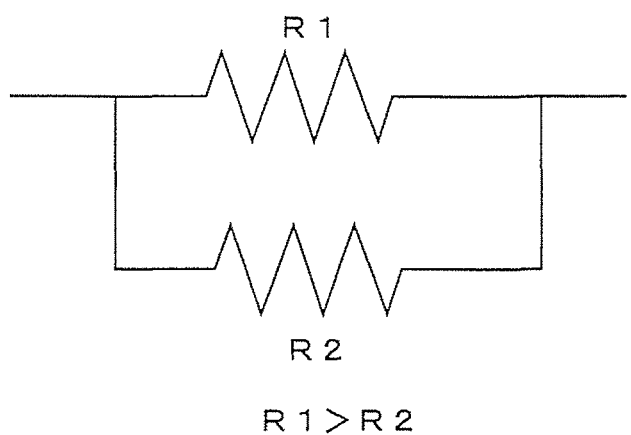
FIG. 10 is a conceptual circuit diagram describing electrical resistance value of piezoelectric body layer and resistance layer.

Electrical resistance value of resistance layer 18 in a multilayer piezoelectric element 10 is lower than that of piezoelectric body layer 12. As shown in FIG. 10, two polarity electrodes of a multilayer piezoelectric element 10 is considered electrically connected in parallel by resistance R1 of piezoelectric body layer 12 and resistance R2 of resistance layer 18. Electrical resistance value of resistance R2 which corresponds to resistance layer 18 is lower than that of resistance R1 which corresponds to piezoelectric body layer 12. For instance, when electrical resistance value (Ω) of piezoelectric body layer 12 (resistance R1) is $10^9$ order, electrical resistance value (Ω) of resistance layer 18 (resistance R2) can be made to $10^6$ order.

Although electrical resistance value of resistance layer 18 may be suitably set in accordance with piezoelectric body layer 12 (resistance R1), in order to suitably transfer an electrical charge generated by pyroelectric effect, it is preferable to set approximately a hundredth or lower of that of piezoelectric body layer 12 (resistance R1). In addition, although lower limit of electrical resistance value of resistance layer 18 is not particularly limited, in order for piezoelectric active site 19a to generate a desired mechanical displacement, it is preferably at least around $10^4$Ω. Electrical resistance value of resistance layer 18 can be adjusted such as by its electrical resistivity, thickness or number of layers, planar shape and the like. Note that although thickness of resistance layer 18 is not particularly limited, it may be around 1 to 20 μm.

Material of resistance layer 18 is not particularly limited as long as electrical resistance value is lower than that of piezoelectric body layer 12, and resistance R2 can suitably discharge an electrical charge generated by pyroelectric effect. In concrete, resin having determined resistance value, insulating resin including conducting particles such as carbon, metal oxide and the like can be exemplified. In addition, materials, having lower resistivity than that of piezoelectric body layer 12 by including conducting particles and the like, are also preferable for materials of resistance layer 18. Note that electrical resistance value of resistance layer 18 is preferably lower than that of insulating layer 17, which prevents migration.

Although manufacturing method of multilayer piezoelectric element 10 is not particularly limited, it can be manufactured such as by the following method.

First, a multilayer body, which becomes element body 11 after firing, is manufactured. In the manufacturing process of the multilayer body, a green sheet, which becomes piezoelectric body layer 12 after firing, a green sheet, wherein internal electrode paste film which becomes the first internal electrode 13 after firing is formed, and a green sheet, wherein internal electrode paste film which becomes the second internal electrode 14 after firing is formed, are prepared.

A green sheet prior to printing internal electrode paste film and a green sheet which becomes piezoelectric body layer 12 are manufactured such as by the below method. First, a raw material of materials composing piezoelectric body layer 12 are homogeneously-mixed by wet mixing and the like, and then dried. Next, preliminary firing is performed under a suitably selected firing condition, and the preliminary firing powders were wet-milled. Then, binder is added to the milled preliminary firing powders to make slurry. Subsequently, the slurry is made to a sheet by a doctor blade method, a screen printing method and the like, and then dried to obtain a green sheet. Note that inevitable impurities can be included in the raw material of materials composing piezoelectric body layer 12.

Next, by coating internal electrode paste including conducting materials on a green sheet by printing method and the like, a green sheet wherein internal electrode paste film of a predetermined pattern is formed can be obtained.

Next, the prepared each green sheet are laminated in a predetermined order. Namely, at the center part of element body 11, a green sheet, wherein internal electrode paste film which becomes the first internal electrode 13 after firing is formed, and a green sheet, wherein internal electrode paste film which becomes the second internal electrode 14 after firing is formed, are alternately laminated. Further, only green sheets, which become piezoelectric body layer 12 after firing, are laminated at a part which becomes both ends of element body 11 after firing.

In addition, it is pressured and pressure bonded after the lamination, and a multilayer body which becomes element body 11 after firing is obtained after required processes such as a drying process and the like. Next, the obtained multilayer body is fired under predetermined conditions and a sintered body is obtained. The first external electrode 15 and the second external electrode 16 are formed on a part of the sintered body, which corresponds to the first side surface 11a and the second side surface 11b respectively, direct voltage is applied to the electrode, and then polarization treatment of piezoelectric body layer 12 is performed. This resulted in a formation of external electrodes 15, 16 on the first side surface 11a and the second side surface 11b, respectively; and element body 11 wherein the third side surface 11c and the fourth side surface 11d are exposed (see FIG. 1).

Before or after firing the multilayer body, a process to cut to an individual piece as shown in FIG. 1 is performed. Further, it is preferable to perform R surface treatment to a corner part and edge line part of element body 11 by performing barrel polishing to the obtained element body 11.

Next, insulating resin is coated on the third side surface 11c and the fourth side surface 11d of element body 11, forming insulating layer 17 shown in FIG. 4 and covering piezoelectric active area 20. Finally, resistance layer 18 is formed on the third side surface 11c wherein insulating layer 17 is formed. Resistance layer 18 is formed by coating insulating resin including conducting particles. Note that insulating layer 17 and resistance layer 18 may be formed by adhering an insulating film or a resistance film or by a thin film formation method such as sputtering and the like. After such processes, multilayer piezoelectric element 10 shown in FIG. 1 is manufactured.

According to multilayer piezoelectric element 10 shown by such as FIGS. 1 and 2, in the third side surface 11c which is a both electrodes exposure surface, piezoelectric active area 20 was covered with insulating layer 17 preventing migration; and the first internal electrode 13 and the second internal electrode 14 exposed to piezoelectric inactive area 22 were connected by resistance layer 18 preventing a decline in a polarization degree due to pyroelectric effect. Further, since resistance layer 18 is isolated from piezoelectric active area 20 by insulating layer 17, short circuit between internal electrodes due to unevenness of electrical resistivity and the like in resistance layer 18 can be prevented.

Further, in multilayer piezoelectric element 10, it is possible to shrink the distance between the first internal electrode 13 and the second internal electrode 14 in piezoelectric active area 20 since resistance layer 18 does not contact piezoelectric active area 20, which is favorable for thinning of piezoelectric body layer 12 and downsizing of multilayer piezoelectric element 10. In addition, it is easily manufactured in a point that a wide acceptable range for unevenness of electrical resistivity in resistance layer 18.

In addition, it is only necessary for resistance layer 18 to connect the first internal electrode 13 and the second internal electrode 14, which are exposed to piezoelectric inactive area 22 in the third side surface 11c. Thus, according to multilayer piezoelectric element 10, it is not necessary to concern that thickness of resistance layer 18 becomes too thin or resistance layer 18 discontinues in such as edge line part of element body 11. This method this is easily manufactured relative to an embodiment forming resistance layer which straddles multiple surfaces of element body 11. In addition, it is possible to make a plural number of connecting parts between resistance layer 18 and the first and the second internal electrodes 13 and 14. Thus, resistance layer 18 securely connects the first internal electrode 13 and the second internal electrode 14, and prevention effect in decline of polarization degree is securely performed.

Note that it is only necessary for insulating layer 17 to have prevention effect of migration, and that it is not necessary to provide conductivity to said insulating layer 17 by halves. Therefore, migration preventing effect of multilayer piezoelectric element 10 can be obtained for certain at a low price.

Figure 11:
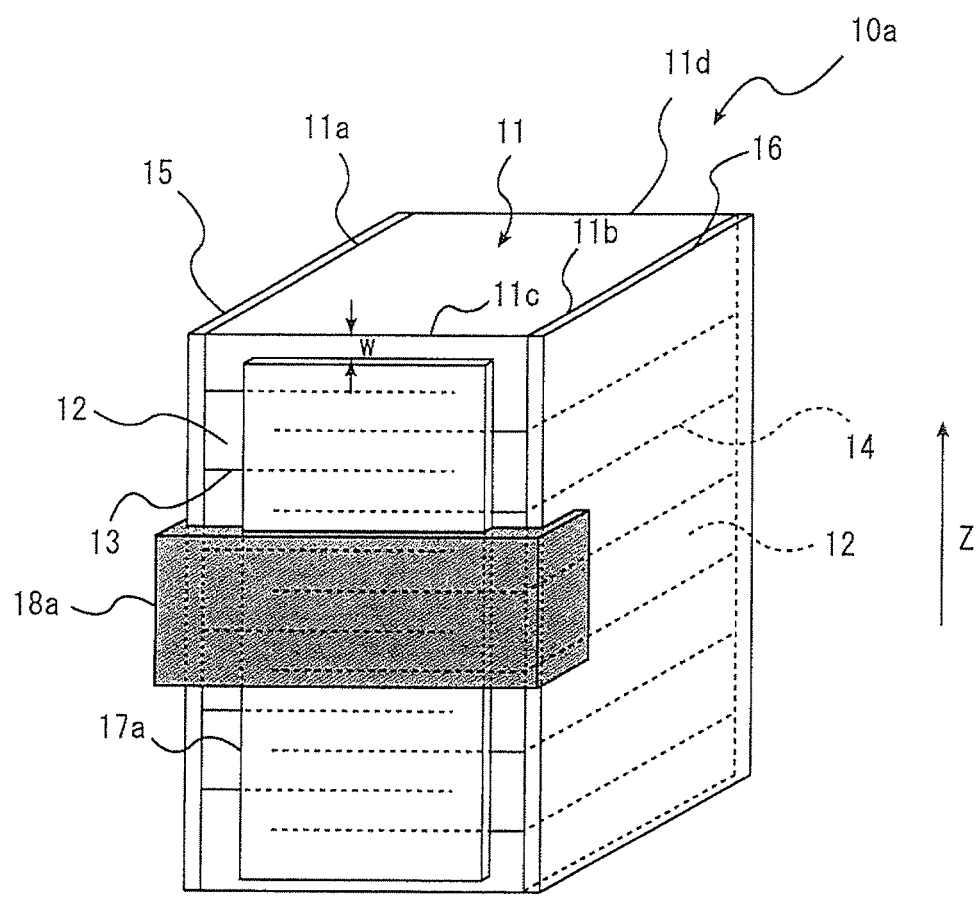
FIG. 11 is a schematic perspective view of multilayer piezoelectric element according to a modified example of the first embodiment.

FIG. 11 is a schematic view of multilayer piezoelectric element 10a according to a modified example of the first embodiment. As shown in FIG. 11, resistance layer 18a of a multilayer piezoelectric element 10a comes around side surfaces wherein the first external electrode 15 and the second external electrode 16 are formed and may be connected to the first external electrode 15 and the second external electrode 16. Insulating layer 17a is not continuous from up and down surfaces in laminating direction, and forms clearance w from up and down surfaces in laminating direction. As described in FIG. 6, an area where clearance w is formed is piezoelectric inactive area 22; and that there is no problem on the point of preventing migration even with such placement of insulating layer 17a. It can prevent insulating layer 17a to be placed in the way when fixing the other member on up and down surfaces of multilayer piezoelectric element 10a, such as by going over up and down surfaces of multilayer piezoelectric element 10a due to variations and the like generated when manufacturing. Thus, the other member can be preferably fixed to up and down surfaces of multilayer piezoelectric element 10a.

THE SECOND EMBODIMENT

Figure 7:
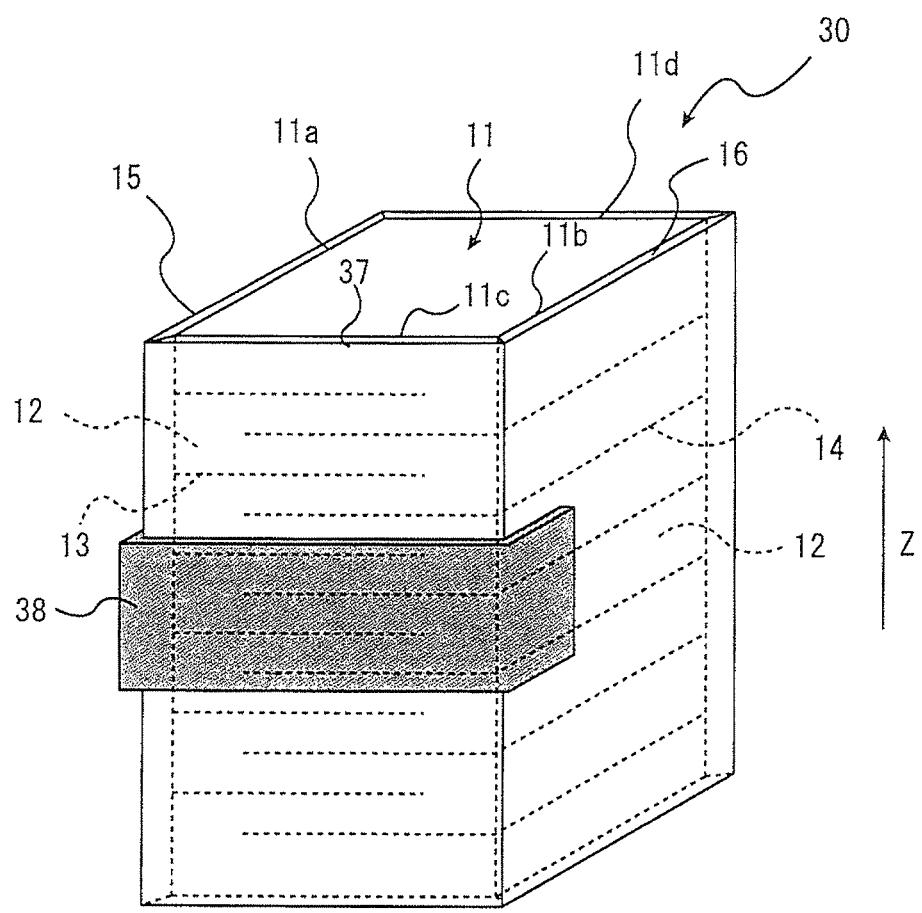
FIG. 7 is a schematic perspective view of multilayer piezoelectric element according to the second embodiment of the present invention emphasizing resistance layer, in particular.
Figure 8:
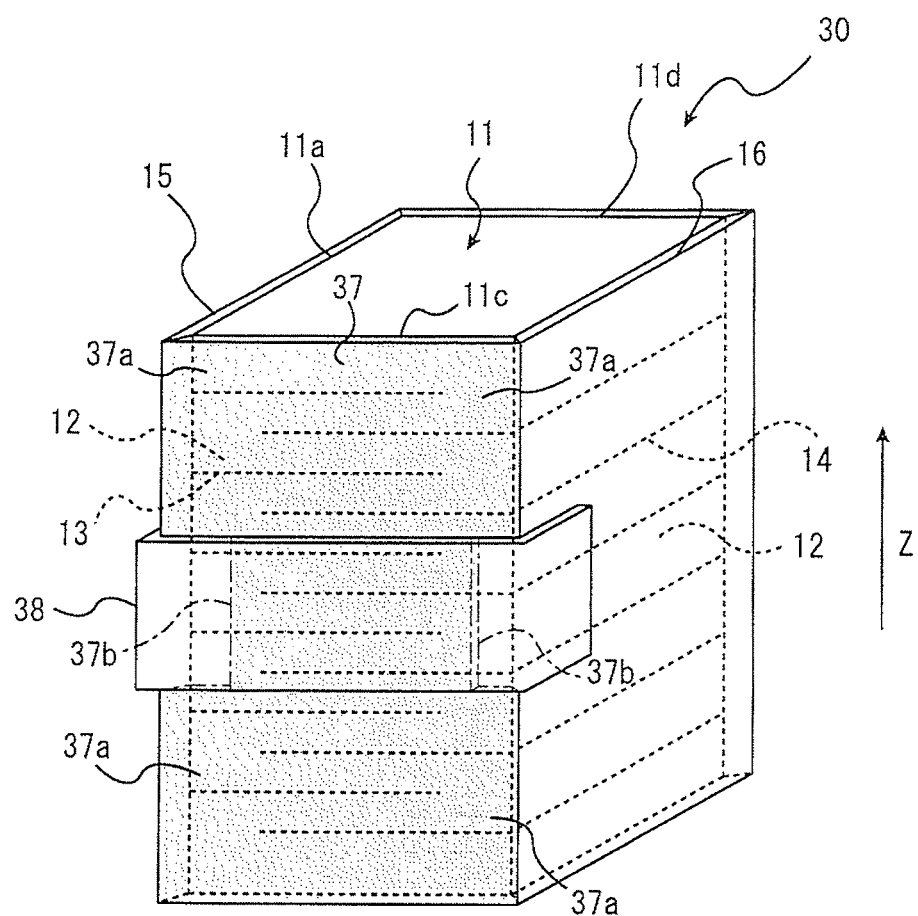
FIG. 8 is a schematic perspective view of multilayer piezoelectric element according to the second embodiment of the present invention emphasizing insulating layer, in particular.

FIGS. 7 and 8 are schematic perspective view showing multilayer piezoelectric element 30 according to the second embodiment of the present invention, and they correspond to FIGS. 1 and 2 of multilayer piezoelectric element 10 (the first embodiment). Multilayer piezoelectric element 30 shown in FIGS. 7 and 8 are the same with multilayer piezoelectric element 10, except shapes of insulating layer 37 and resistance layer 38, and that the explanation of overlapped parts will be abbreviated.

As shown in FIG. 8, insulating layer 37 of multilayer piezoelectric element 10 not only covers piezoelectric active area 20 of the third side surface 11c but comprises expanded portion 37a which covers a part of piezoelectric inactive area 22 (See FIG. 6). Expanded portion 37a forms cutout 37b, wherein at least a part of the first internal electrode 13 and the second internal electrode 14 of piezoelectric inactive area 22 are exposed. A shape of cutout 37b is not particularly limited as long as resistance layer 38 is connected to the first internal electrode 13 and the second internal electrode 14, and for instance, a through-hole is also considered as such cutout 37b.

As shown in FIG. 8, resistance layer 38 connects the first internal electrode 13 and the second internal electrode 14 exposed to the third side surface 11c, via two cutouts 37b formed on insulating layer 37. Further, resistance layer 38 is formed to come around the first side surface 11a, wherein the first external electrode 15 is formed, and the second side surface 11b, wherein the second external electrode 16 is formed; and resistance layer 38 is connected to the first external electrode 15 and the second external electrode 16.

Multilayer piezoelectric element 30 shows the same effect with multilayer piezoelectric element 10 shown in FIG. 1. In addition, multilayer piezoelectric element 30 not only connects the first internal electrode 13 and the second internal electrode 14 at the third side surface 11c, which is a both electrodes exposure surface, but also connected to the first external electrode 15 and the second external electrode 16. Thus, both electrodes are securely connected and manufacturing variations of characteristics can be prevented. Further, expanded portion 37a covering piezoelectric inactive area 22 prevents exposure of the first internal electrode 13 and the second internal electrode 14 on a surface of multilayer piezoelectric element 30 and protects the first internal electrode 13 and the second internal electrode 14.

THE THIRD EMBODIMENT

Figure 9:
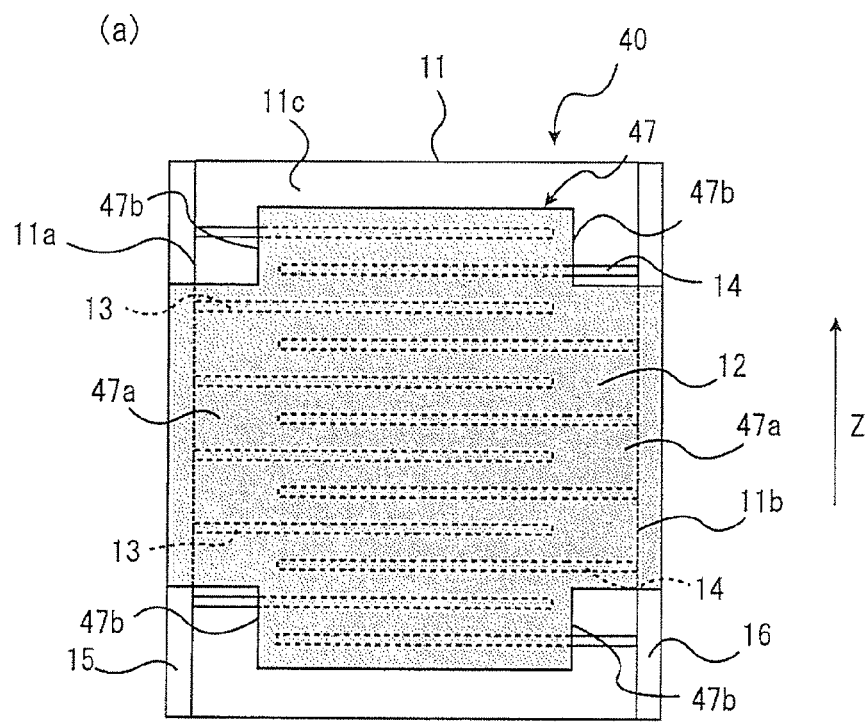
FIG. 9 is a planar view showing shapes of insulating layer and resistance layer of multilayer piezoelectric element according to the third embodiment of the present invention.
Figure 9:
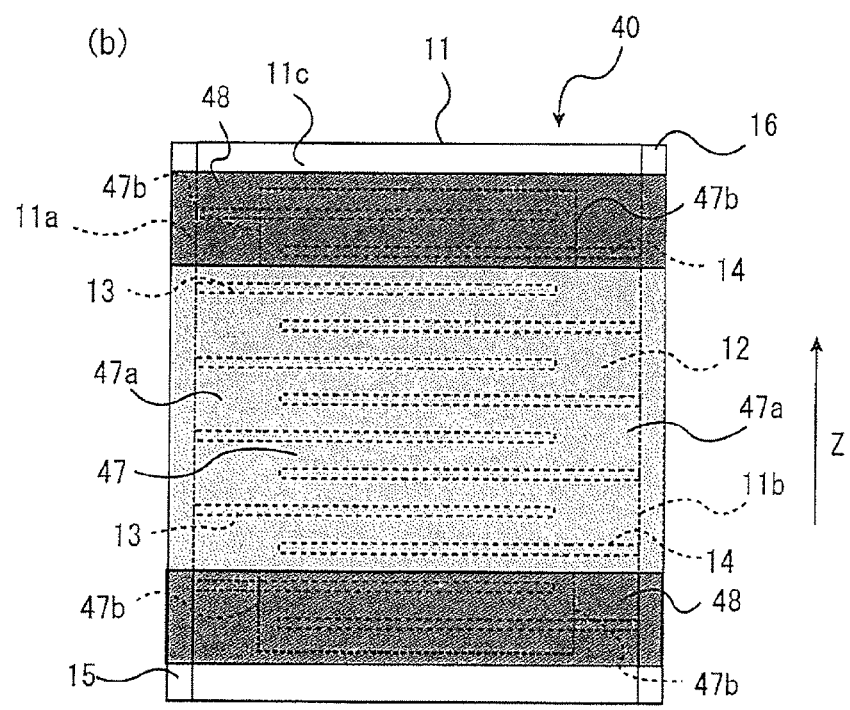

FIGS. 9(a) and 9(b) are planar views showing multilayer piezoelectric element 40 according to the third embodiment of the present invention. They are seen from the front of the third side surface 11c of element body 11. In FIG. 9(a), insulating layer 47 is emphasized by a pale shaded area and a figure of resistance layer 48 is abbreviated. Insulating layer 47 of multilayer piezoelectric element 40, as is the same with insulating layer 37 (see FIG. 8) of multilayer piezoelectric element 30, comprises expanded portion 47a which covers piezoelectric inactive area 22. At four corners of expanded portion 47a, cutouts 47b are formed. Due to said cutouts 47b, parts of the first internal electrode 13 and that of the second internal electrode 14 at piezoelectric inactive area 22 (See FIG. 6) are exposed from insulating layer 47.

FIG. 9(b) shows resistance layer 48 placed on top of FIG. 9(a), and said resistance layer 48 is emphasized by a dark shaded area. Resistance layer 48 connects the first internal electrode 13 and the second internal electrode 14 exposed to the third side surface 11c via cutouts 47b formed at four corners of insulating layer 47. Resistance layers 48 are separately placed at 2 places sandwiching at least a part of insulating layer 47 along laminating direction Z.

Multilayer piezoelectric element 40 is the same with laminated piezoelectric element 30 according to the third embodiment except for shapes and placement of insulating layer 47 and resistance layer 48, and achieves the same effect with laminated piezoelectric element 30.

As described in the first to the third embodiment, shapes, partition number and the like of insulating layer and that of resistance layer can be suitably modified according to members and the like placed on the periphery of multilayer piezoelectric element; and such modified examples are included within the scope of the present invention.

The invention claimed is:

1. A multilayer piezoelectric element comprising;
an element body having a first and second internal electrodes exposure surface comprising a piezoelectric active area, wherein a first internal electrode faces a second internal electrode sandwiching piezoelectric body layer in-between along laminating direction, and a piezoelectric inactive area, wherein the piezoelectric body layer contacts only the first internal electrode or the second internal electrode at one face along laminating direction, or the first internal electrodes face each other or the second internal electrodes face each other sandwiching piezoelectric body layer in-between along laminating direction,
an insulating layer which covers the piezoelectric active area of the first and second internal electrodes exposure surface, a resistance layer which is isolated from the piezoelectric active area by the insulating layer, placed at the first and second internal electrodes exposure surface in order to connect at least a part of the first internal electrode in the piezoelectric inactive area and at least a part of the second internal electrode in the piezoelectric inactive area, and has lower electrical resistance value relative to that of the piezoelectric body layer, a first external electrode electrically connected to the first internal electrode, and a second external electrode electrically connected to the second internal electrode.

2. The multilayer piezoelectric element as set forth in claim 1 wherein the resistance layer is connected to the first external electrode and the second external electrode.

3. The multilayer piezoelectric element as set forth in claim 1 wherein the insulating layer comprises an expanded portion covering the piezoelectric inactive area, and a cutout is formed at the expanded portion in order to expose at least a part of the first internal electrode and that of the second internal electrode in the piezoelectric inactive area.

4. The multilayer piezoelectric element as set forth in claim 1 wherein the resistance layer is placed at the center part of the first and second internal electrodes exposure surface along the laminating direction.

5. The multilayer piezoelectric element as set forth in claim 1 wherein the resistance layer is separately placed at 2 or more places on the first and second internal electrodes exposure surface, sandwiching at least a part of the insulating layer along the laminating direction.

6. A multilayer piezoelectric element comprising;

an element body having a first and second internal electrodes exposure surface comprising a piezoelectric active area, wherein a first internal electrode faces a second internal electrode sandwiching piezoelectric body layer in-between along laminating direction, and a piezoelectric inactive area, wherein the piezoelectric body layer contacts only the first internal electrode or the second internal electrode at one face along laminating direction, or the first internal electrodes face each other or the second internal electrodes face each other sandwiching piezoelectric body layer in-between along laminating direction, an insulating layer which covers the piezoelectric active area of the first and second internal electrodes exposure surface, a resistance layer which is isolated from the piezoelectric active area by the insulating layer, placed at the first and second internal electrodes exposure surface in order to connect at least a part of the first internal electrode in the piezoelectric inactive area and at least a part of the second internal electrode in the piezoelectric inactive area, and has lower electrical resistance value relative to that of the piezoelectric body layer, a first external electrode electrically connected to the first internal electrode, and a second external electrode electrically connected to the second internal electrode, wherein the element body comprises the first surface and the second surface, which sandwich the first and second internal electrodes exposure surface in a direction perpendicular to the laminating direction, and face in mutually opposing direction, the first external electrode is placed at the first surface and the second external electrode is placed at the second surface.

7. The multilayer piezoelectric element as set forth in claim 6 wherein the resistance layer is connected to the first external electrode and the second external electrode.

8. The multilayer piezoelectric element as set forth in claim 6 wherein the insulating layer comprises an expanded portion covering the piezoelectric inactive area, and a cutout is formed at the expanded portion in order to expose at least a part of the first internal electrode and that of the second internal electrode in the piezoelectric inactive area.

9. The multilayer piezoelectric element as set forth in claim 6 wherein the resistance layer is placed at the center part of the first and second internal electrodes exposure surface along the laminating direction.

10. The multilayer piezoelectric element as set forth in claim 6 wherein the resistance layer is separately placed at 2 or more places on the first and second internal electrodes exposure surface, sandwiching at least a part of the insulating layer along the laminating direction.

* * * * *